United States Patent [19]

Mendelsohn et al.

[11] 4,030,892

[45] June 21, 1977

[54] FLEXIBLE ELECTROMAGNETIC SHIELD COMPRISING INTERLACED GLASSY ALLOY FILAMENTS

[75] Inventors: Lewis Isaac Mendelsohn, Morristown; Ethan Allen Nesbitt, Beach Haven, both of N.J.

[73] Assignee: Allied Chemical Corporation, Morristown, N.J.

[22] Filed: Mar. 2, 1976

[21] Appl. No.: 663,172

[52] U.S. Cl. .............................. 428/226; 75/123 B; 75/123 K; 75/170; 148/31.55; 335/214; 335/296; 423/276; 423/289; 423/299

[51] Int. Cl.² ................. B21C 37/00; C04B 35/00; H01H 1/00

[58] Field of Search .......................... 148/31.55, 34; 29/191.6, 193, 196; 335/214, 296, 301; 75/122, 123 B, 123 K, 170; 164/89; 331/156

[56] References Cited

UNITED STATES PATENTS

| 2,234,038 | 3/1941 | Bedford et al. | 335/214 |
| 3,427,154 | 2/1969 | Mader et al. | 148/31.55 |
| 3,756,788 | 9/1973 | Whetstone | 29/196 |
| 3,820,040 | 6/1974 | Berry et al. | 331/156 |
| 3,845,805 | 11/1974 | Kavesh | 164/89 |
| 3,856,513 | 12/1974 | Chen et al. | 75/122 |

*Primary Examiner*—Walter R. Satterfield
*Attorney, Agent, or Firm*—David W. Collins; Ernest A. Polin

[57] ABSTRACT

A flexible electromagnetic shield is provided. The shield comprises interlaced filaments of at least one glassy metal alloy. The glassy alloy has a maximum permeability of at least about 50,000 and a coercivity of less than about 0.08 Oe.

11 Claims, 4 Drawing Figures

FLEXIBLE ELECTROMAGNETIC SHIELD COMPRISING INTERLACED GLASSY ALLOY FILAMENTS

BACKGROUND OF THE INVENTION

1. Field of the Invention

This invention relates to electromagnetic shields for minimizing electromagnetic fields which interfere with the operation of electrical and magnetic devices.

2. Description of the Prior Art

Electromagnetic shields are used for minimizing and reducing to substantially zero electromagnetic fields which interfere with the operation of electrical and magnetic devices. For example, in color television receivers, the electron beam of the picture tube generally requires shielding from interference by 60 Hz fields produced internally by transformers or other electrical components. Shielding is also required from interference by external equipment, such as permanent magnets and electromagnets, since these also may adversely affect picture quality. Similarly, magnetic tape used in computers as well as for recording sound must also be shielded from stray fields.

Presently, such shielding usually consists of punched and drawn stampings from crystalline alloys. For example, where high permeability is required, alloys such as the 80/20 nickle-iron series (sold under the designation Mumetal, Hymu 80, Moly Permalloy) or the 50/50 nickle-iron series (4750 Alloy, Hipernik) are used. Where high saturation induction at moderate permeability is required, ingot iron or 3 percent silicon iron is used.

For example, for protecting instrumentation from the earth's field, high permeability 80/20 nickel-iron alloy shields will reduce the field to less than one tenth of its original value (about 0.5 gauss in the U.S.A.). These shields are ideal for low field applications. However, if it should be desired to protect an aircraft compass system from the large stray fields (about 20 to 30 gauss) produced by devices containing permanent magnets, such as d'Arsonval ammeters and voltmeters, magnetrons, magnetic recorders, permanent magnet motors and the like, then ingot iron sheet or silicon iron sheet with their higher saturation induction are wrapped around the stray field source to absorb most of the stray flux. If additional shielding is desired, present practice adds a high permeability nickle-iron shield about ¼ inch away from the ingot iron to further reduce the field to extremely low values.

The shielding materials commonly employed in commercial practice suffer from several major drawbacks. First, all alloys must be heat treated, usually in pure dry hydrogen, at temperatures above 800° C to achieve optimum magnetic properties. Second, after this costly annealing, any slight bending strain will substantially lower the maximum permeability. Further, when these crystalline materials are formed into complex shapes, they must be reannealed at elevated temperatures to regain their outstanding magnetic properties. However, such reannealing does not permit close dimensional tolerances to be maintained. As a consequence, flexible shields having desirable magnetic properties are not readily available.

SUMMARY OF THE INVENTION

In accordance with the invention, a flexible electromagnetic shield is provided which comprises interlaced filaments of at least one metal alloy. This metal alloy is at least 50% glassy and has a maximum permeability of at least about 50,000 and a coercivity of less than about 0.08 Oe.

DETAILED DESCRIPTION OF THE INVENTION

Figure 1:
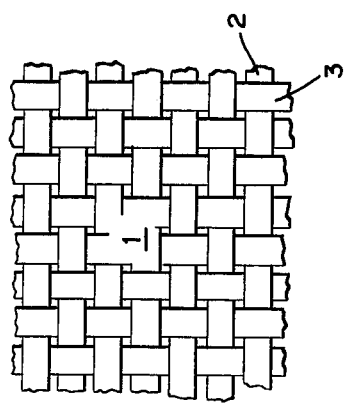
FIG. 1 is a detailed plan view of flexible electromagnetic shielding fabric, showing a typical pattern comprising interlaced filaments.

A flexible electromagnetic shield is provided which comprises interlaced filaments of at least one metal alloy, that is at least 50% glassy and has a maximum permeability of at least about 50,000 and a coercivity of less than about 0.08 Oe.

The glassy metal alloys have the composition $M_a X_b$, where M is at least one element of iron and cobalt, X is at least one element of boron, carbon and phosphorus, "a" ranges from about 75 to 85 atom percent and "b" ranges from about 15 to 25 atom percent. Up to about one-half of M may be nickel, in order to obtain high permeability values. Up to about 10 atom percent of iron and/or cobalt may be replaced by other transition metal elements such as chromium, copper, manganese, molybdenum, niobium, tantalum and tungsten to obtain enhancement of specific properties such as hardness, corrosion resistance and the like. Examples of glassy alloys suitably employed in the invention include the following nominal compositions: $Fe_{40}Ni_{40}P_{14}B_6$, $Fe_{80}B_{20}$, $Co_{74}Fe_6B_{20}$ and $Fe_{71}Mo_9C_{18}B_2$ (the subscripts are in atom percent). The purity of all compositions is that found in normal commercial practice.

At a given field strength, the higher the permeability, the greater the effectiveness of a magnetic shield. A maximum permeability, $\mu_{max}$, of at least about 50,000 is necessary to develop useful shielding. A low coercive force, $H_c$, is desirable, since the operating permeability increases with increasing field strength. A coercive force of less than about 0.08 Oe is necessary to permit the operating permeability to be attained quickly. Since, to a first approximation, $$\mu_{max} = B_r/H_c$$

where $B_r$ is the remanence, then the value of the remanence can be determined. For $\mu_{max} = 50,000$ and $H_c = 0.08$ Oe, then $B_r = 4,000$ Gauss. The higher this value, the greater the flux that can be drawn into the material and hence the greater the shielding ability.

Preferably, the maximum permeability is at least 100,000 and the coercive force is less than about 0.04 Oe. Such values, which may be achieved by suitable processing, increase the shielding ratio.

As employed in this application, interlacing includes operations such as weaving, knitting and braiding. Filaments as used herein may be ribbon or wire having cross-sectional configurations such as rectilinear, generally circular, elliptical, and variants thereof. While the alloy is at least 50% glassy, it is preferred that it be completely glassy (e.g., in the order of at least about 90% glassy) in order to take advantage of the increasing ductility with increasing degree of glassiness.

The term "glassy", as used herein, means a state of matter in which the component atoms are arranged in a disorderly array; that is, there is no long range order. Such a glassy material gives rise to broad, diffuse diffraction peaks when subjected to electromagnetic radiation having wavelengths in the X-ray region (about 0.01 to 50 Angstrom wavelength). This is in contrast to crystalline material, in which the component atoms are arranged in an orderly array and which gives rise to sharp diffraction peaks.

Glassy alloys such as $Fe_{40}Ni_{40}P_{14}B_6$ and $Fe_{80}B_{20}$ have the advantage that they develop their exceptionally high permeability as-quenched during their processing. Details of the processing to form glassy metal alloys are readily available; see, e.g., U.S. Pat. Nos. 3,856,513, issued Dec. 24, 1974 and 3,845,805, issued Nov. 5, 1974.

Table I shows the remarkable as-quenched properties of two glassy alloys suitable for shielding purposes. Also shown in Table I are the improved properties of these glassy alloys resulting from field annealing. In Table I, $B_s(80)$ is the saturation induction at a field of 80 Oe, $\mu_{max}$ is the maximum permeability, B at $\mu_{max}$ is the induction at maximum permeability, $H_c$ is the coercive force and $B_r(0)$ is the residual induction. These glassy alloys, which are conveniently processed according to the teachings of U.S. Pat. No. 3,856,513, in their as-quenched condition can be strained to appreciable stresses, such as to about 10,000 to 15,000 psi, without substantial loss in magnetic properties after the strain is removed. The nickel-iron alloy in Table I is particularly useful for low field applications (less than 1 Gauss) where high permeability is desired. The iron alloy in Table I is most suited where high saturation together with high permeability is desired. While Table I gives two examples of alloys suitable in the practice of the invention, it will be understood that the other glassy alloys possessing at least the minimum properties described above are also suitable.

in thickness from 0.0015 to 0.003 inch and in width from 0.070 to 0.150 inch, for example, can be used as yarn for weaving fabric. Commercial weaving machinery where the longitudinal fibers (warp) are at right angles to the shuttled fibers (woof) which run across the width of the fabric is easily available for manufacturing fabric up to 60 inches in width. FIG. 1 depicts a portion of flexible electromagnetic shielding fabric 1, illustrating a useful weaving pattern of interlaced filaments, here ribbons, 2 and 3. Wires may be similarly interlaced. Braiding machines for braiding yarn around a flexible tube (of polyethylene for example) may be used to braid glassy yarn into a continuous tube. Here the yarn fibers are braided at a 45° angle to the length of the tube and approximately at 90° to one another. Knitting machinery is also commercially available and can be used to knit round wire into fabric. Patterns of interlacing can be varied to modify properties of the flexible electromagnetic shield.

All of these fabric producing processes lend themselves to producing a flexible electromagnetic shielding material with magnetic properties are very similar to those of commercially available crystalline nickel-iron alloys and with mechanical properites superior to those of the commercially available crystalline alloys. The density of interlacing may be as high or as low as desired, so long as the structural integrity of the flexible electromagnetic shield remains unimpaired. The interlacing may be done using the same alloy throughout. Alternatively, more than one alloy, whether glassy or not, may be interlaced in various patterns to combine certain desirable properties of each alloy. For example, a glassy alloy having a high permeability, such as $Fe_{40}Ni_{40}P_{14}B_6$, may be interlaced with a glassy alloy having a high flux carrying capacity, such as $Fe_{80}B_{20}$.

As stated above, the flexible electromagnetic shield of the invention retains its outstanding magnetic characteristics even after being strained. The ability to control the interlacing pattern permits fabrication of complex geometric shapes without attendant costly annealing steps required for commercial cyrstalline alloys. While the as-cast glassy alloy filaments are useful in their processed condition, further processing such as annealing, which includes heat treating in air, inert gas or in a vacuum and/or in a magnetic field, results in substantial improvement of these properties. Also, the glassy alloy filaments can be plated, such as with copper or brass, to improve higher frequency characteristics for eddy current shielding.

EXAMPLES

Crystalline Mumetal shielding material is currently

TABLE I

| Alloy (Atom percent) | $B_s(80)$, Gauss | $\mu_{max}$ | B at $\mu_{max}$, Gauss | $H_c$, Oe | $B_r(0)$, Gauss |
|---|---|---|---|---|---|
| $Fe_{40}Ni_{40}P_{14}B_6$ (as-quenched) | 6,300 | 65,000 | 3,300 | 0.05 | 4,000 |
| $Fe_{40}Ni_{40}P_{14}B_6$ Field Annealed* | 7,700 | 800,000 | 5,600 | 0.007 | 6,000 |
| $Fe_{80}B_{20}$ As-quenched | 15,500 | 102,000 | 8,500 | 0.08 | 8,150 |
| $Fe_{80}B_{20}$ Field Annealed** | 16,800 | 300,000 | 13,000 | 0.04 | 12,300 |

* Annealed at 325° C for 2 hr at 10 Oe in partial vacuum (<1000 μm)
**Annealed at 325° C for 3 hr at 10 Oe in partial vacuum (<1000 μm)

This invention utilizes the yarn-like qualities of the product resulting from the rapid quenching glassy metal process. Continuous round fibers of about 0.004 to 0.010 inch in diameter or continuous ribbon ranging readily available as strips about 4-inch wide and about 0.002 inch thick. This material was wound into cylinders which were four inches in length and either one or two inches in diameter. By butting three such crystalline 80/20 nickel-iron (Mumetal) cylinders end to end with a ⅛ inch overlap to achieve an approximate overall length of twelve inches, comparison was made to woven flexible electromagnetic shields of the invention.

Test procedure A346 –64 of the American Society for Testing Materials entitled "Alternating Current Magnetic Properties of Laminated Core Specimens" was followed in detail in evaluating the shields. The arrangement of that test procedure was followed in detail with one exception.

As the maximum dimension to be tested was 2 inches in diameter and as only comparative data, as opposed to absolute data were sought, the coil diameters were made 14 inches in diameter, rather than 48 inches. Otherwise the procedure followed that of the ASTM procedure. A 2 kVA variable transformer supplies 60Hz power. A Hewlett-Packard model 400F AC voltmeter, a Weston No. 1242 digital multimeter and a 5000 series Tektronix oscilloscope completed the measuring equipment.

Figure 2:
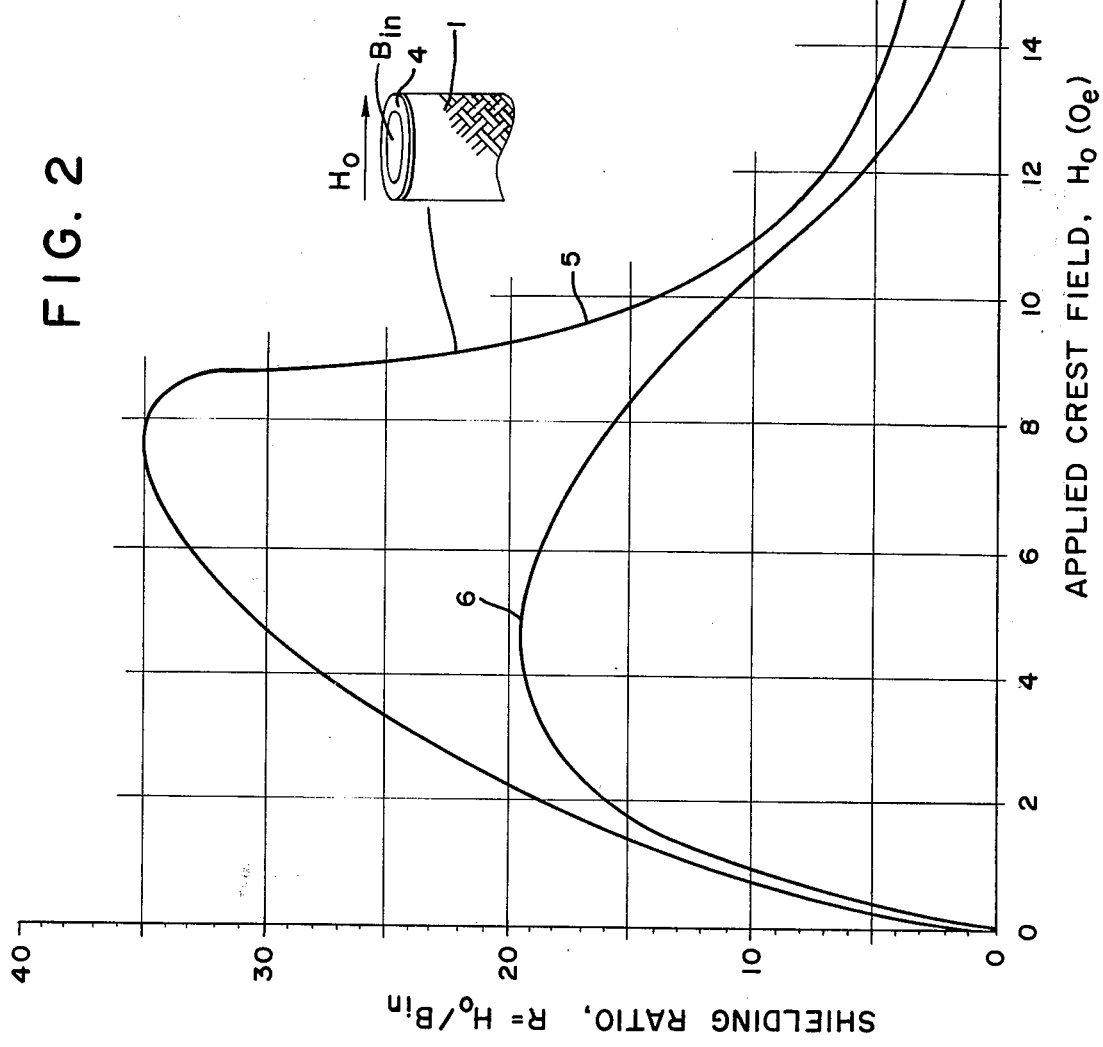
FIG. 2, on coordinates of shielding ratio and applied crest field, is a plot comparing the shielding ratio of a braided cylinder of a flexible electromagnetic shield of the invention, shown in schematic representation, with Mumetal sheet formed into a cylinder.

The Helmholtz coil was calibrated by measuring the field at its center with no shields present ($H_0$ The coils produced a uniform field $H_{cr}$ of 4.0 crest Oe per rms ampere flowing through them in series. $H_0$ was the rms value of $H_{cr}$ in other words, $H_{cr}=\sqrt{2}\ H_0$ From the ammeter reading, the value of $H_0$ in Oe was determined. The voltage induced in the pick-up coil with no shield present was also recorded and this was called E1. $H_{cr}$ was proportional to $E_1$. A cylindrical shield was inserted between the Helmholtz pair with its long axis parallel to the plane of the Helmholtz pair. A search coil was inserted inside the shield and a voltage $E_2$, which was attenuated below $E_1$, was measured. The voltage $E_2$ was a measure of the inducton inside the cylinder, $B_{in}$. The relationship of the cylindrical shield to the applied field is shown in FIG. 2, which includes a schematic representation of a portion of flexible electromagnetic shield fabric supported on a plexiglas tube. By definition, the ratio of $E_2/E_1$ was the attenuation ratio. Its reciprocal, the ratio $E_1/E_2$, or $H_0/B_{in}$, was called the shielding ratio.

EXAMPLE 1

A flexible electromagnetic shield in the form of a seamless braided fabric was fabricated about 1 inch in diameter by 18 inches long and weighing about 23 g. To compare this braided fabric sample with Mumetal sheet stock, the cylinder was mounted on a plastic tube. A similar cylinder was rolled out of 4 inch wide 0.002 inch thick sheet of nickel-iron 80/20 (Mumetal) onto a 1 inch diameter plastic tube. The sheet was formed into a cylinder which was 1 inch in diameter and 20 inches long, again weighing about 23 g. Braided and sheet stock shields of similar dimensions thus were compared.

FIG. 2 depicts the shielding ratio as a function of applied crest field (curve 5) for a 1 inch diameter, 10 inch long seamless braided cylinder of a flexible shield 1 of the invention mounted on a plexiglass tube 4. The composition of the filaments was glassy $Fe_{40}Ni_{40}P_{14}B_6$. Also shown is the shielding ratio as a function of applied crest field (curve 6) for a 10 inch long, 1 inch diameter tube rolled from four inch wide Mumetal sheet with an overlap of 0.86 inch. It is seen that the flexible shield of the invention is superior to the Mumetal shield, which means that at 60 Hz and for field strengths of 20 Oe and below, the permeability of the as-quenched glassy alloy is 1.5 to 2 times that of Mumetal which has been formed and stressed to conform to a 1 inch diameter. 1.5 to 2 times that of Mumetal which has been formed and stressed to conform to a 1 inch diameter.

EXAMPLE 2

Figure 3:
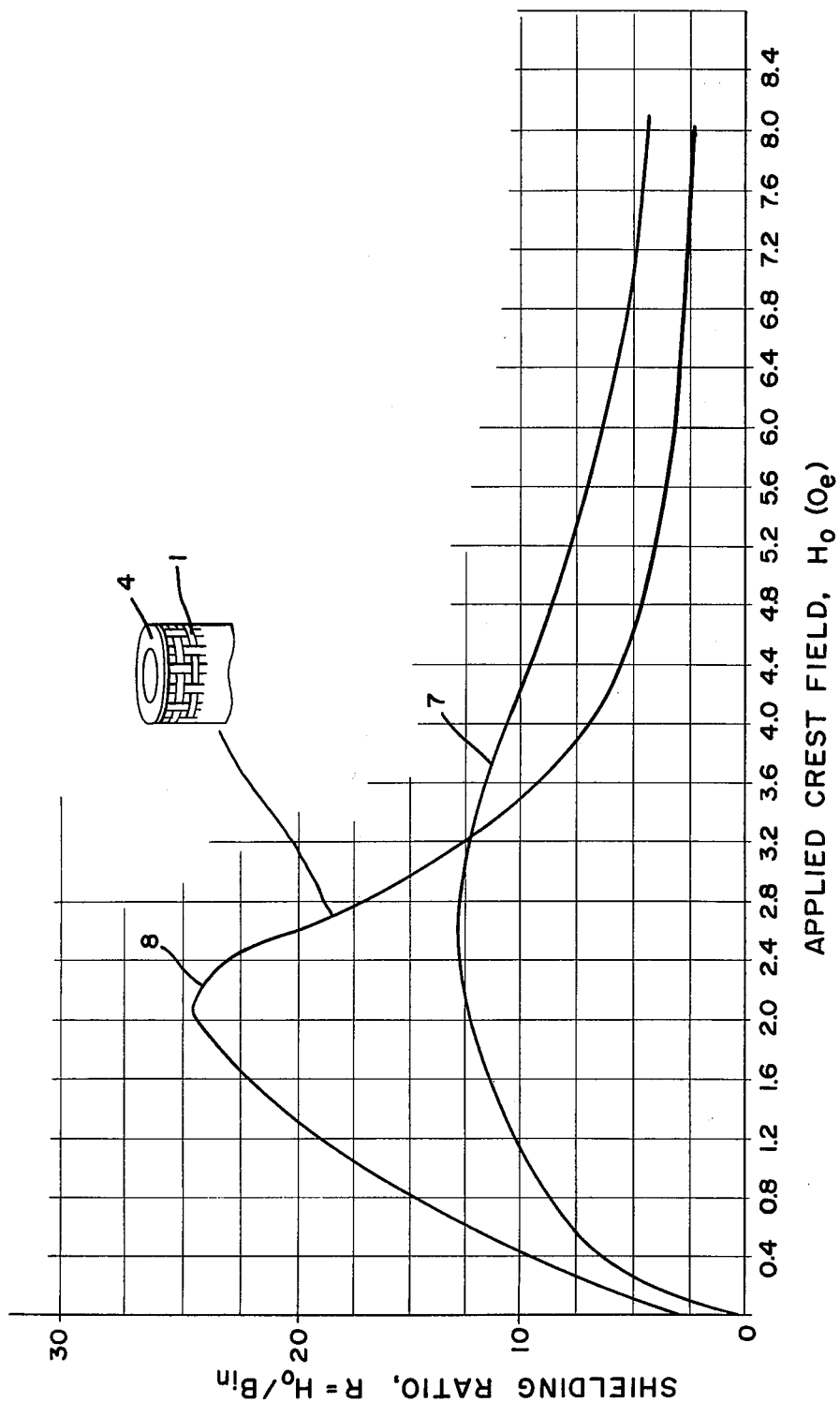
FIG. 3, on coordinates of shielding ratio and applied crest field, is a plot comparing the shielding ratio of a totally woven seamless cylinder of a flexible electromagnetic shield of the invention, shown in schematic representation, with Mumetal sheet formed into a cylinder.

Weaving permitted fabrication of larger diameter cylinders. A 2 inch diameter seamless cylinder, 9 inch long was woven on a conventional continuous weave loom. A similar cylinder was rolled up out of 12 inch wide flat flexible fabric with about a ¼ inch seam. For evaluating the two woven flexible shields, three pieces of 4 inch wide crystalline sheet nickel-iron alloy (Mumetal) were wrapped to make three cylinders 2 inches in diameter and 4 inches long. These three cylinders were butted or slightly overlapped to form a single cylinder which simulated the woven cylinders. Each of the three cylinders, both the two flexible fabric cylinders, as well as the sheet metal cylinders, weighed about 27 g. FIG. 3 depicts the shielding ratio as a function of applied crest field (curve 8) for a totally woven cylinder of glassy metal alloy electromagnetic shielding fabric 1 having the composition $Fe_{40}Ni_{40}P_{14}B_6$ mounted on a plexiglass tube 4. Also shown is the shielding ratio as a function of applied crest field (curve 7) for the Mumetal shield described above. The shielding ratios are lower than those of FIG. 2 because larger diameter cavities are more difficult to shield than small ones.

Figure 4:
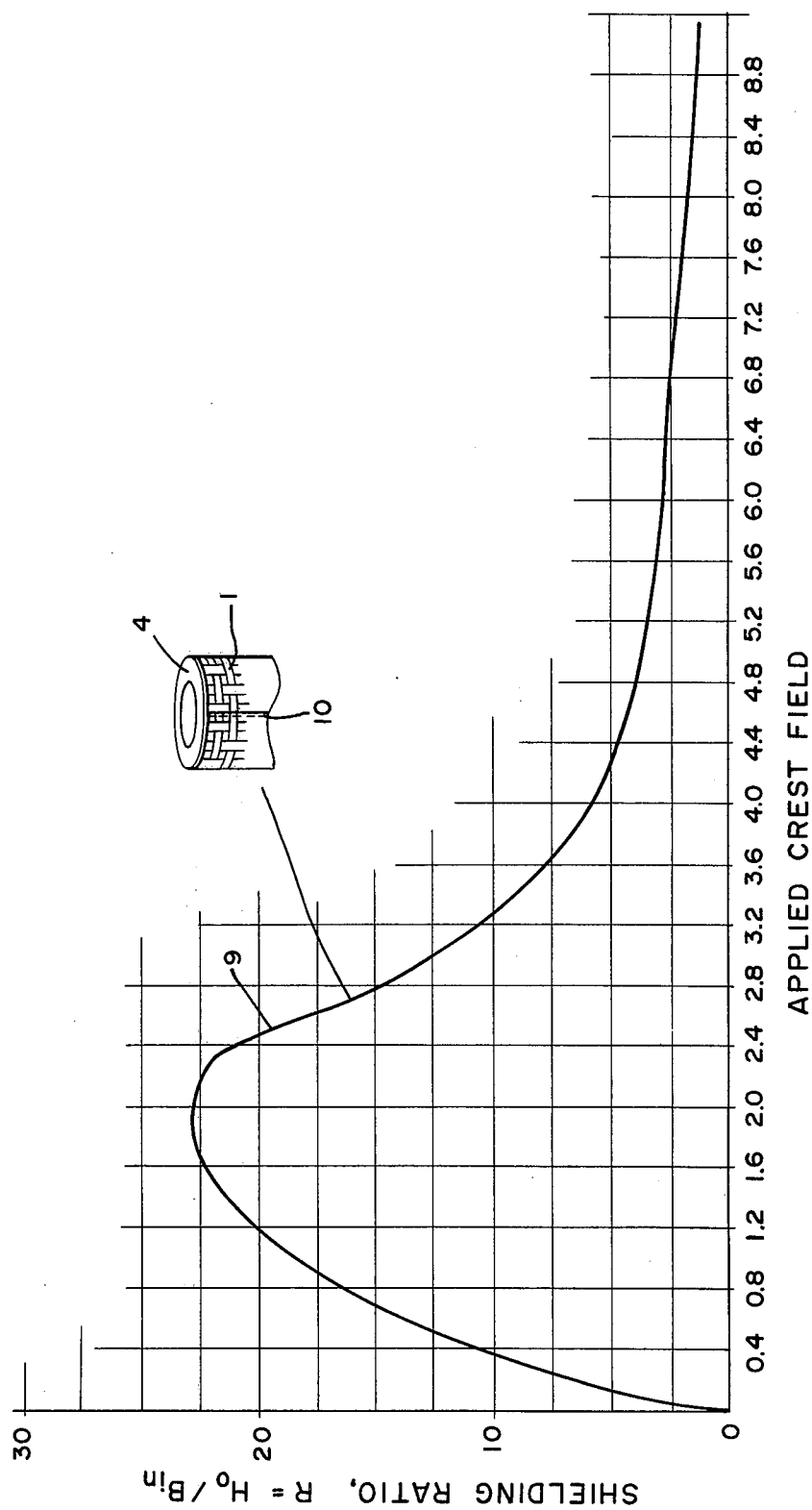
FIG. 4, on coordinates of shielding ratio and applied crest field, is a plot of the shielding ratio of a cylinder fabricated from a woven fabric of a flexible electromagnetic shield of the invention, shown in schematic representation, rolled with an overlap seam to simulate the fully woven cylinder of FIG. 3.

FIG. 4 illustrates the shielding ratio as a function of applied crest field (curve 9) for electromagnetic shielding fabric 1 of the invention which was 2 inches in diameter, 12 inches long which was rolled on a plexiglass tube 4 using flat flexible woven fabric (glassy $Fe_{40}Ni_{40}P_{14}B_6$ with a ¼ inch seam 10 to simulate the fully woven cylinder of FIG. 3. A comparison of the curves of FIGS. 3 and 4 shows very little difference between a fully woven seamless cylinder and one rolled up from woven sheet fabric.

The highest shielding ratio, 47.8, achieved so far was obtained from a flexible electromagnetic shield subjected to a mild heat treatment at 325° C for 2 hours in a vacuum with a 10 Oe circumferential field applied. This shielding ratio was measured for a 2 inch diameter cylinder of glassy metal alloy fabric having the composition $Fe_{40}Ni_{40}P_{14}B_6$. Heat treatment with a longitudinally applied field or a circumferentially applied field or a combination of the two is expected to further improve the fabric's low field permeability and hence the shielding ratio.

What is claimed is:
1. A flexible electromagnetic shield which comprises interlaced filaments, said filaments comprising at least one metal alloy that is at least 50% glassy, said metal alloy having the composition $M_aX_b$, where M is at least one element selected from the group consisting of iron and cobalt, X is at least one element selected from the group consisting of boron, carbon and phosphorus, "a" ranges from about 75 to 85 atom percent, "b" ranges from about 15 to 25 atom percent, and a maximum permeability of at least about 50,000 and a coercivity of less than about 0.08 Oe.

2. The flexible electromagnetic shield of claim 1 in which the metal alloy is at least about 90% glassy.

3. The flexible electromagnetic shield of claim 1 having maximum permeability of at least about 1,000,000 and a coercivity of less than aobut 0.04 Oe.

4. The flexible electromagnetic shield of claim 1 in which up to about one-half of M is replaced by nickel.

5. The flexible electromagnetic shield of claim 1 in which up to about 10 atom percent of iron and/or cobalt is replaced by at least one element selected from the group consisting of chromium, copper, manganese, molybdenum, niobium, tantalum and tungsten.

6. The flexible electromagnetic shield of claim 4 in which the glassy metal alloy has the composition $Fe_{40}Ni_{40}P_{14}B_6$.

7. The flexible electromagnetic shield of claim 1 in which the glassy metal alloy has the composition $Fe_{80}B_{20}$.

8. The flexible electromagnetic shield of claim 1 in which the glassy metal alloy has the composition $Co_{74}Fe_6B_{20}$.

9. The flexible electromagnetic shield of claim 1 in which the glassy metal alloy has the composition $Fe_{71}Mo_9C_{18}B_2$.

10. The flexible electromagnetic shield according to claim 6 annealed at about 325° C for 2 hrs at 10 Oe in a partial vacuum of less than about 1000 $\mu$m.

11. The flexible electromagnetic shield according to claim 7 annealed at about 325° C for 3 hrs at 10 Oe in a partial vacuum of less than about 1000 $\mu$m.

* * * * *

UNITED STATES PATENT OFFICE
CERTIFICATE OF CORRECTION

Patent No. 4,030,892          Dated June 21, 1977

Inventor(s) Lewis Isaac Mendelsohn, Ethan Allen Nesbitt

It is certified that error appears in the above-identified patent and that said Letters Patent are hereby corrected as shown below:

Col. 3, line 51, insert "magnetic" before "properties".

Col. 5, line 25, insert ")." after "($H_o$".

line 28, insert a period after "$H_o$".

line 31, change "El" to read -- $E_1$ --.

Col. 6, lines 4 and 5, delete entirely.

line 68, change "1000,000 to -- 100,000 -- and "aobut" to -- about --.

Signed and Sealed this

Third Day of January 1978

[SEAL]

Attest:

RUTH C. MASON
Attesting Officer

LUTRELLE F. PARKER
Acting Commissioner of Patents and Trademarks